(12) United States Patent
Wang et al.

(10) Patent No.: US 9,129,973 B2
(45) Date of Patent: Sep. 8, 2015

(54) CIRCUIT PROBING STRUCTURES AND METHODS FOR PROBING THE SAME

(75) Inventors: Mill-Jer Wang, Hsin-Chu (TW); Ching-Nen Peng, Hsin-Chu (TW); Hung-Chih Lin, Hsin-Chu (TW); Hao Chen, Luzhou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 518 days.

(21) Appl. No.: 13/313,907

(22) Filed: Dec. 7, 2011

(65) Prior Publication Data

US 2013/0147049 A1   Jun. 13, 2013

(51) Int. Cl.
*H01L 21/66* (2006.01)
*H01L 23/544* (2006.01)
*H01L 23/58* (2006.01)
*H01L 23/00* (2006.01)

(52) U.S. Cl.
CPC .............. *H01L 23/544* (2013.01); *H01L 22/32* (2013.01); *H01L 24/16* (2013.01); *H01L 24/17* (2013.01); *H01L 22/30* (2013.01); *H01L 22/34* (2013.01); *H01L 2223/5442* (2013.01); *H01L 2223/54406* (2013.01); *H01L 2223/54426* (2013.01); *H01L 2223/54433* (2013.01); *H01L 2223/54473* (2013.01); *H01L 2224/16225* (2013.01); *H01L 2224/1712* (2013.01); *H01L 2225/06596* (2013.01)

(58) Field of Classification Search
CPC ............... H01L 22/32; H01L 22/34; H01L 2225/06596; H01L 23/544; H01L 22/30
USPC ........................................................... 257/48
See application file for complete search history.

(56) References Cited

U.S. PATENT DOCUMENTS

| | | | | |
|---|---|---|---|---|
| 4,951,098 A * | 8/1990 | Albergo et al. | ............... | 257/48 |
| 6,064,213 A * | 5/2000 | Khandros et al. | ........ | 324/750.05 |
| 6,204,074 B1 * | 3/2001 | Bertolet et al. | ............... | 438/18 |
| 6,359,342 B1 * | 3/2002 | Yuan et al. | .................... | 257/784 |
| 6,369,407 B1 * | 4/2002 | Hikita et al. | .................... | 257/48 |
| 6,445,001 B2 * | 9/2002 | Yoshida | ........................ | 257/48 |
| 6,534,853 B2 * | 3/2003 | Liu et al. | ...................... | 257/692 |
| 6,573,143 B1 * | 6/2003 | Li et al. | ........................ | 438/270 |
| 6,844,631 B2 * | 1/2005 | Yong et al. | .................. | 257/786 |
| 6,861,749 B2 * | 3/2005 | Wu et al. | ..................... | 257/737 |
| 6,897,669 B2 * | 5/2005 | Ishio et al. | ..................... | 257/48 |
| 6,940,093 B2 * | 9/2005 | Eldridge et al. | ............... | 257/48 |
| 7,102,371 B1 * | 9/2006 | Tang et al. | .............. | 324/754.11 |
| 7,247,879 B2 * | 7/2007 | Nishimura et al. | ............. | 257/50 |
| 7,288,846 B2 * | 10/2007 | Sasaki | .......................... | 257/786 |
| 7,344,968 B2 * | 3/2008 | Sasaki | .......................... | 438/611 |
| 8,691,601 B2 * | 4/2014 | Izuha | .............................. | 438/18 |
| 2011/0049515 A1 * | 3/2011 | Kuo et al. | ....................... | 257/48 |
| 2012/0002456 A1 * | 1/2012 | Oh | ................................. | 365/63 |
| 2013/0078745 A1 | 3/2013 | Wang et al. | | |

* cited by examiner

*Primary Examiner* — David Zarneke
(74) *Attorney, Agent, or Firm* — Slater & Matsil, L.L.P.

(57) ABSTRACT

A package component includes a stack-probe unit, which includes a first-type connector, and a second-type connector connected to the first-type connector. The first-type connector and the second-type connector are exposed through a surface of the package component.

19 Claims, 14 Drawing Sheets

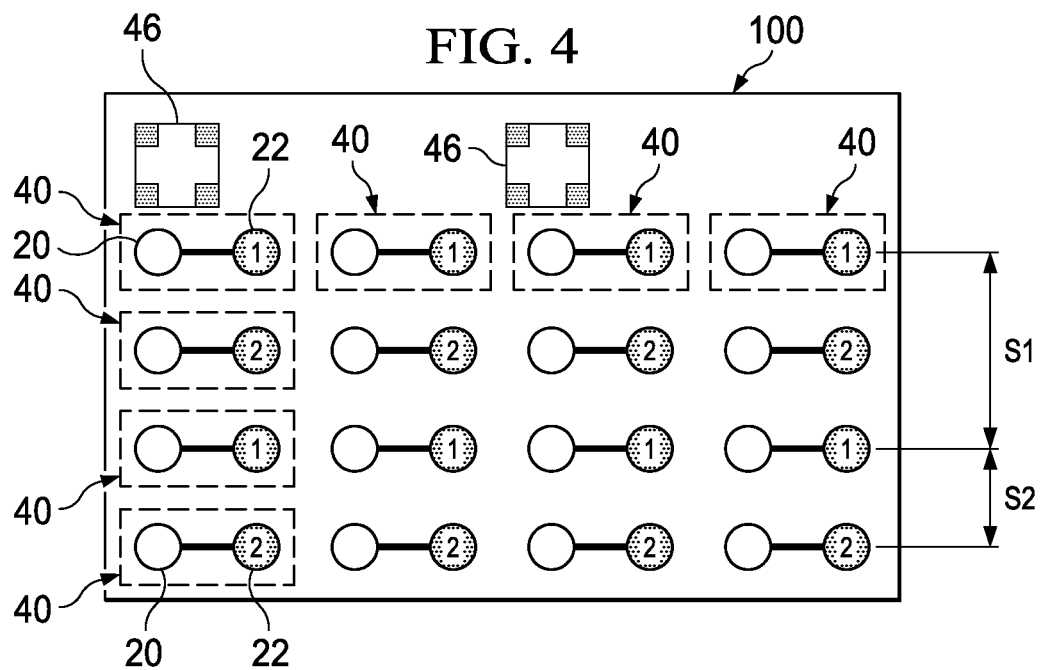
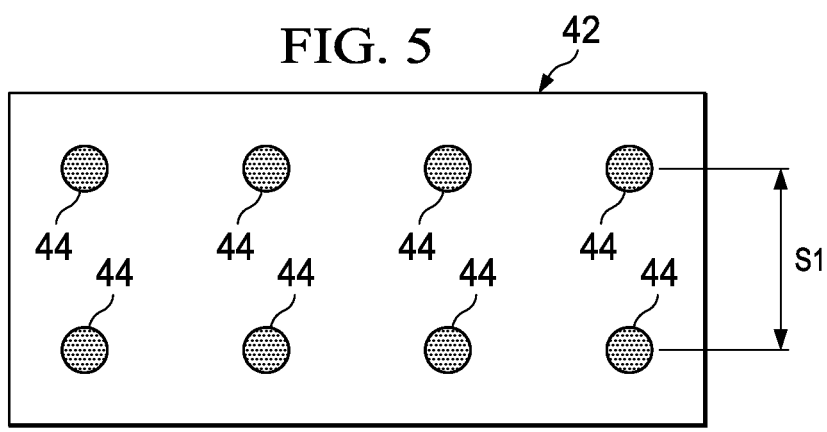

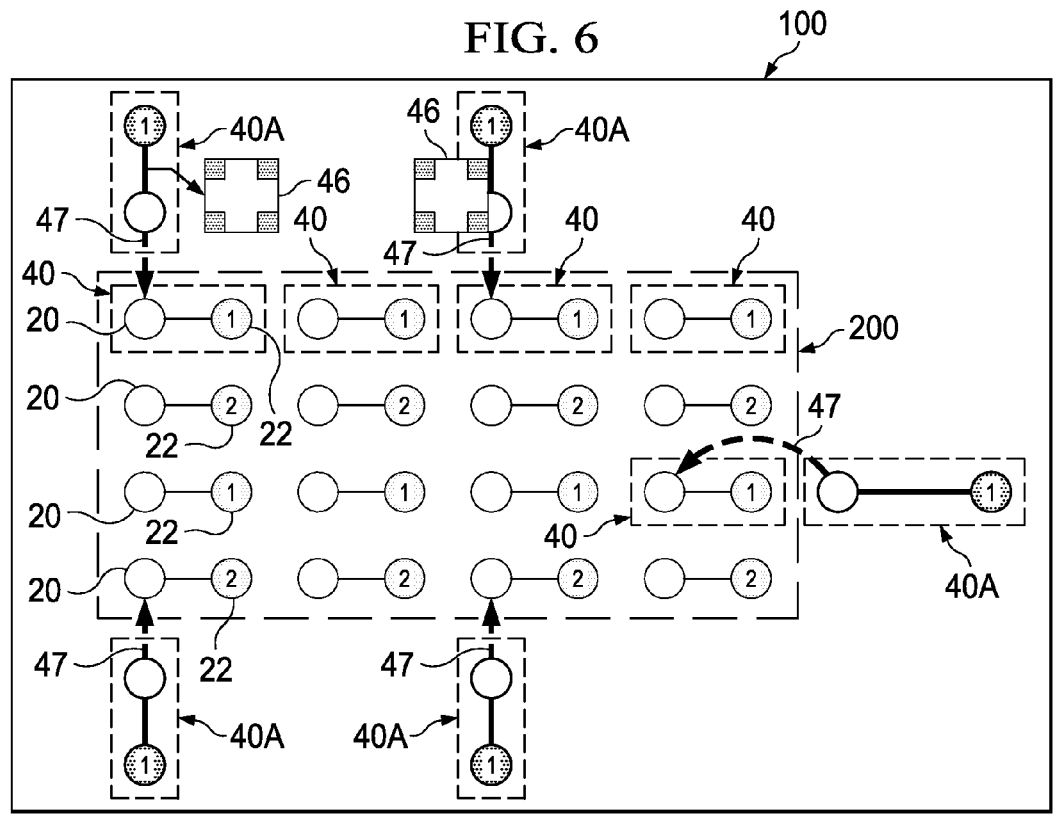
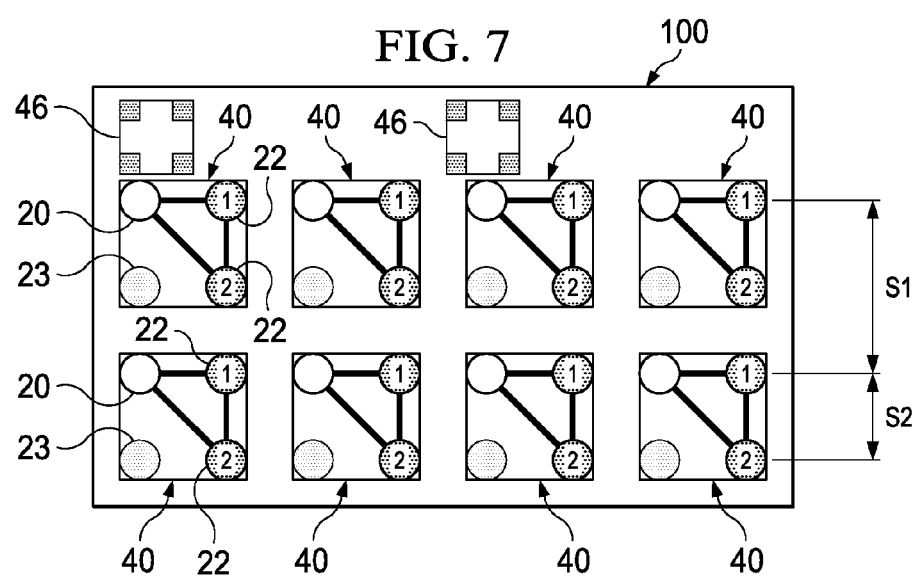

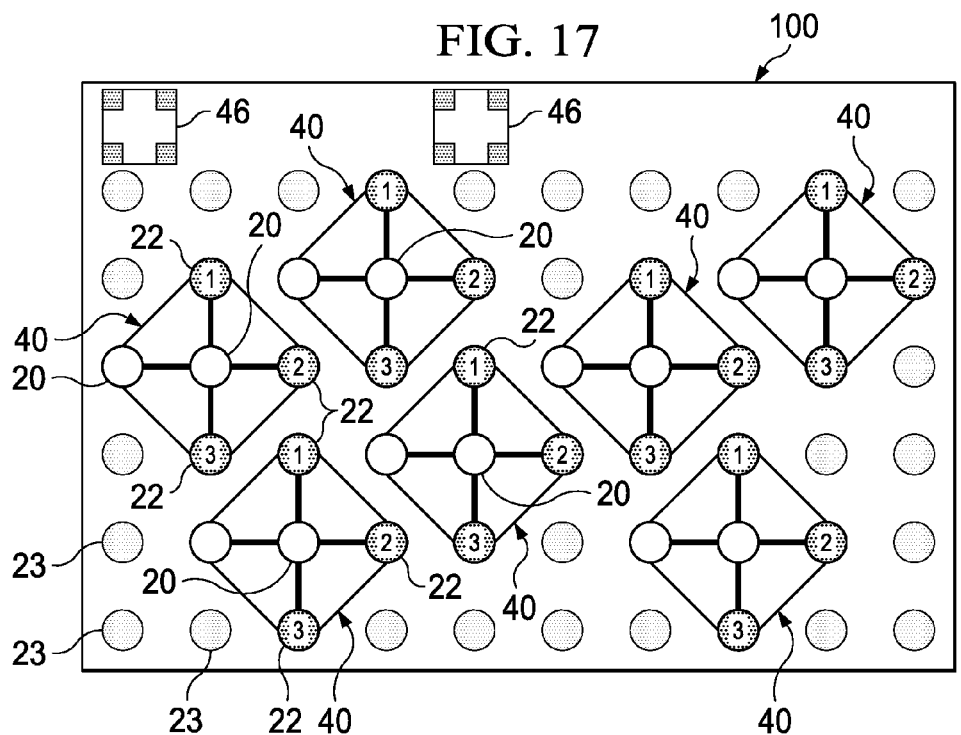
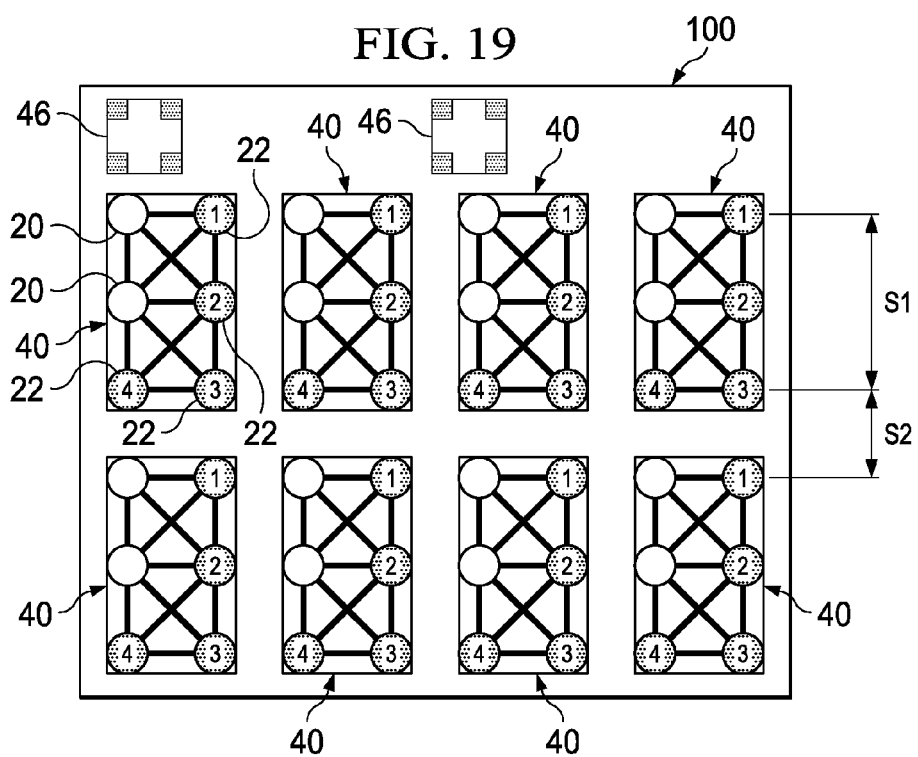

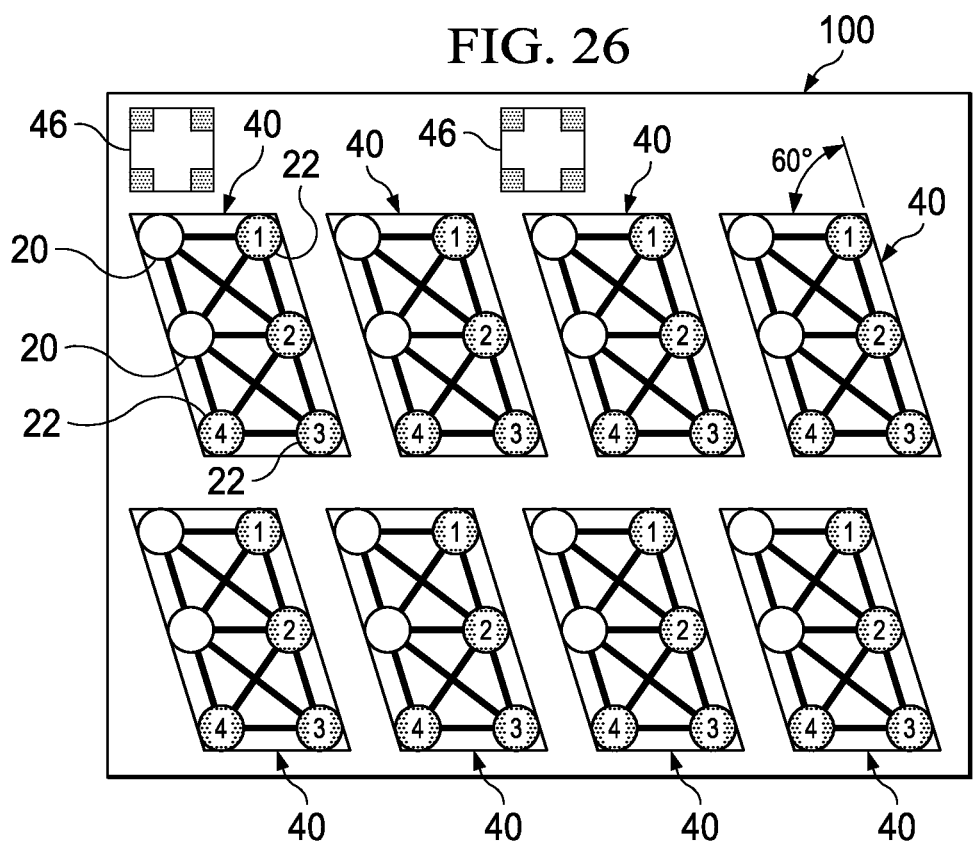

CIRCUIT PROBING STRUCTURES AND METHODS FOR PROBING THE SAME

BACKGROUND

Integrated circuits need to be tested and probed in various manufacturing stages. After a die that comprises the integrated circuits is formed, a probe step needs to be performed. In some approaches, the probe structures such as the probe pads, however, are already covered by a surface dielectric layer such as a polyimide layer. Therefore, no probe structure is exposed and can be used for probing. On the other hand, electrical connectors are available on the surface of the die, the connectors are not suitable for probing because probing may damage the electrical connectors.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 4 through 20 are stack-probe units formed in package components in accordance with various embodiments, wherein the normal connectors and sacrificial connectors in a stack-probe unit may have a 1-to-1, 1-to-N, M-to-1, and M-to-N correspondence, with M and N representing integers greater than 1;

FIG. 26 illustrates a stack-probe unit in accordance with some embodiments, wherein lines drawn between normal connectors and sacrificial connectors form 60 degree angles.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Probe structures and methods for probing the same are provided in accordance with various embodiments. Throughout various views and illustrative embodiments, like reference numbers are used to designate like elements.

Figure 1:
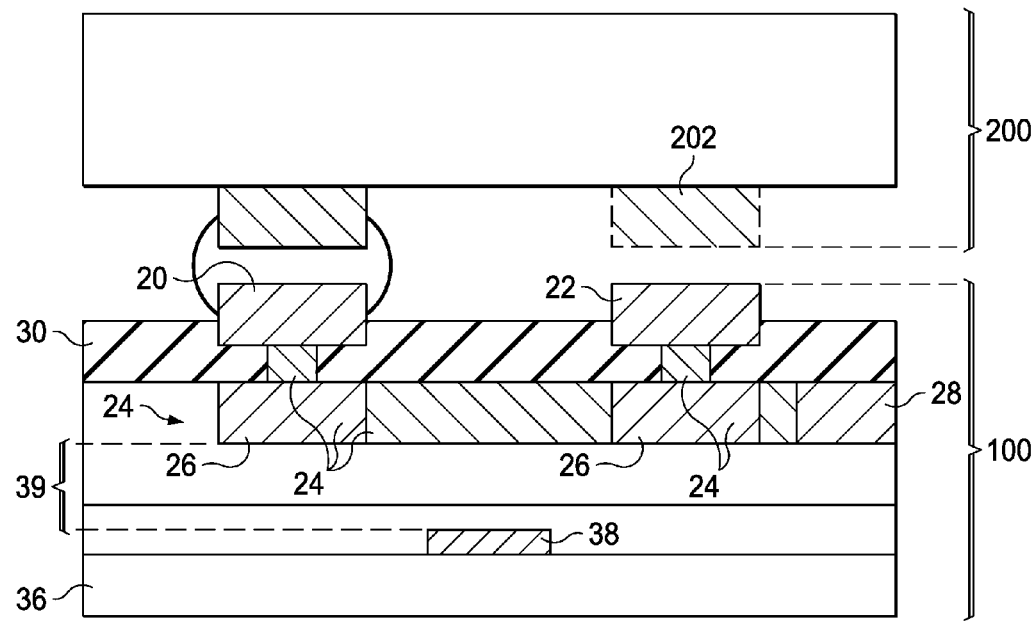
FIG. 1 illustrates a cross-sectional view of a package in accordance with some embodiments, wherein two package components are bonded, and normal connectors for bonding the two package components and sacrificial connectors are illustrated.

FIG. 1 illustrates a cross-sectional view of a Three-Dimensional Integrated Circuit (3DIC) package, which includes package components 100 and 200 bonded to each other, in accordance with some embodiments. Each of package components 100 and 200 is a device die including active devices such as transistors, interposers, package substrates, packages including a die bonded to a package substrate/interposer, or the like. Each of package components 100 and 200 is at a die level or a wafer level. As a result, the bonding between components 100 and 200 is die-to-die bonding, die-to-wafer bonding, or wafer-to-wafer bonding. In some embodiments, package component 100 includes normal connectors 20 and sacrificial connectors 22, which are disposed at a surface of package component 100. Throughout the description, normal connectors 20 and sacrificial connectors 22 are alternatively referred to a first-type connectors and second-type connectors, respectively. In some embodiments, normal connectors 20 are used for bonding package component 100 to package component 200, and are used for electrically interconnecting devices and conductive features in package components 100 and 200. In some embodiments, sacrificial connectors 22 are used for probing purposes, and may not have electrical functions for interconnecting the devices in package components 100 and 200. Accordingly, after bonding package components 100 and 200, sacrificial connectors 22 may not be bonded to any connectors (including dummy connectors) in package component 200. Alternatively, sacrificial connectors 22 may be bonded to dummy connector(s) such as a dummy connector 202 in package component 200.

Normal connectors 20 and sacrificial connectors 22 are electrically connected to each other through one or a plurality of connections 24, which includes one or a plurality of metal lines, vias, metal pads, or the like. In FIG. 1, metal pads are denoted as reference numbers 26. FIG. 1 illustrates that connections 24 includes a plurality of vias and a plurality of metal lines. Under normal connectors 20 and sacrificial connectors 22, there are normal metal pads 26 and sacrificial pads 28. Normal metal pads 26 also act as parts of connections 24. In some embodiments, normal metal pads 26 are not used for probing purposes, while sacrificial pads 28 are used for probing purposes. As a result, any damages to sacrificial pads 28 will not affect the function of package component 100. Top dielectric layer 30 is formed over normal pads 26 and sacrificial pads 28. In some embodiments, top dielectric layer 30 is a polymer layer such as a polyimide layer. In some embodiments, normal pads 26, sacrificial pads 28, and/or polymer layer 30 may not be formed.

Package component 100 also includes substrate 36, which is a semiconductor substrate in accordance with some exemplary embodiments. Devices such as transistors 38 in FIG. 1 are formed on a semiconductor substrate. An overlying interconnect structure 39, which includes metal lines and vias (not shown), is formed over substrate 36 and devices 38.

Figure 2:
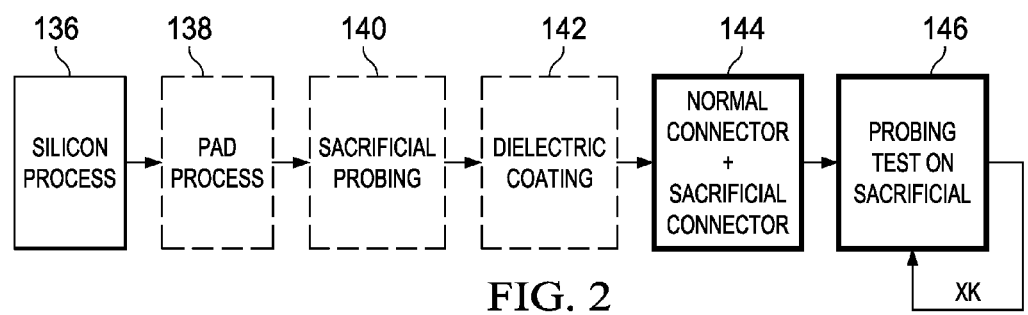
FIG. 2 schematically illustrates a process flow for manufacturing a package component, and for probing the devices in the package component through sacrificial connectors, in accordance with some embodiments.

FIG. 2 illustrates a process for forming and probing package component 100 in accordance with some embodiments. In some embodiments, as shown in step 136, a silicon process is performed to form devices 38 and interconnect structure 39. In step 138, a pad process is performed, in which normal metal pads 26 and sacrificial pads 28 are formed. In step 140, a sacrificial probing is performed, in which sacrificial pads 28 may be probed to determine the connection status of normal pads 26. In step 142, dielectric coating such as dielectric layer 30 in FIG. 1 is formed. Steps 138, 140, and 142 are shown using dashed boxes to indicate that these steps may not be performed in some embodiments. Step 144 illustrates the formation of normal connectors 20 and sacrificial connectors 22 in FIG. 1. In some embodiments, there may be 1 or a plurality of normal connectors 20 electrically interconnected with 1 or a plurality of sacrificial connectors 22. For illustration, the interconnected normal connectors 20 and sacrificial connectors 22 are referred to as a stack-probe unit.

In step 146, a probing test is performed on sacrificial connectors 22 for one or multiple (K) times to determine the connection status of normal connectors 20. During probing, a probe device such as a probe card 42 in FIG. 5 is used. In some embodiments, the probe card 42 includes probe pins for contacting sacrificial connectors 22. During probing, sacrificial connectors 22 may be damaged. In some embodiments, normal connectors 20 are used for stacking, and no probing is performed on normal connectors 20. As a result, by probing sacrificial connectors 22 without probing normal connectors 20, normal connectors 20 are protected from potential damages due to probing.

Figure 3:
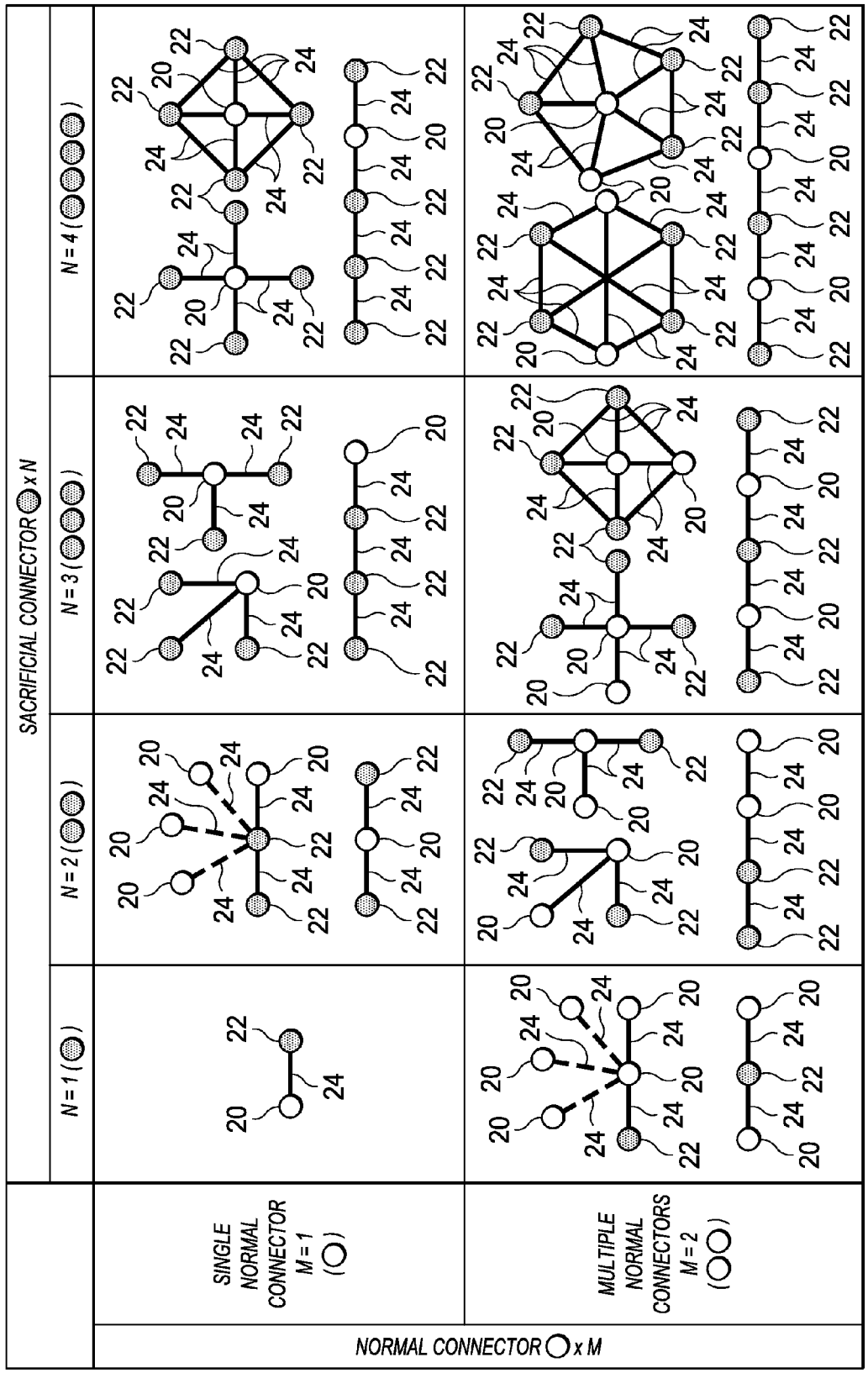
FIG. 3 illustrates some exemplary connections between normal connectors and sacrificial connectors in accordance with some embodiments.

FIG. 3 illustrates a table showing the possible connection schemes between normal connectors 20 and sacrificial connectors 22 in accordance with some embodiments. FIG. 3 illustrates the exemplary connection schemes of 1 or 2 normal connectors 20 connected to 1, 2, 3, or 4 sacrificial connectors 22. Additional schemes are within the scope of various embodiments. In FIG. 3, shaded circles represent sacrificial connectors 22, while un-shaded circles represent normal connectors 20. The lines between connectors 20 and 22 are electrical connections 24. In each of the cells of the table in FIG. 3, there may be a plurality of connections schemes, with a group of interconnected connectors 20 and 22 representing a possible stack-probe unit. In various embodiments, normal connectors 20 and sacrificial connectors 22 may have other top-view shapes. Exemplary top-view shapes include lines, crosses, fan shapes, rectangles, and polygons, etc.

In FIG. 3, number M represents the number of normal connectors 20 in a stack-probe unit. Number N represents the number of sacrificial connectors 22 in a stack-probe unit. The solid lines represent the electrical connections. Each table cell includes one or a plurality of stack-probe units. All sacrificial connectors 22 and normal connectors 20 in the same stack-probe unit are interconnected through electrical connections 24. The dashed lines represent the alternative positions of the electrical connections 24. The table cell corresponding to M equal to 1 and N equal to 1 illustrates exemplary connection schemes of an exemplary stack-probe unit having one normal connector 20 and one sacrificial connector 22. The table cell corresponding to M equal to 1 and N equal to 2 illustrates exemplary connection schemes of some exemplary stack-probe units having one normal connector 20 and two sacrificial connectors 22. The table cell corresponding to M equal to 1 and N equal to 3 illustrates exemplary connection schemes of some exemplary stack-probe units having one normal connector 20 and three sacrificial connectors 22. The table cell corresponding to M equal to 1 and N equal to 4 illustrates exemplary connection schemes of some exemplary stack-probe units having one normal connector 20 and four sacrificial connectors 22. The table cell corresponding to M equal to 2 and N equal to 1 illustrates exemplary connection schemes of some exemplary stack-probe units having two normal connectors 20 and one sacrificial connector 22. The table cell corresponding to M equal to 2 and N equal to 2 illustrates exemplary connection schemes of some exemplary stack-probe units having two normal connectors 20 and two sacrificial connectors 22. The table cell corresponding to M equal to 2 and N equal to 3 illustrates exemplary connection schemes of some exemplary stack-probe units having two normal connectors 20 and three sacrificial connectors 22. The table cell corresponding to M equal to 2 and N equal to 4 illustrates exemplary connection schemes of some exemplary stack-probe units having two normal connectors 20 and four sacrificial connectors 22.

FIGS. 4 through 20 illustrate the top views of probe structures in accordance with various embodiments. Throughout these figures, unless specified otherwise, shaded circles again represent sacrificial connectors 22, while un-shaded circles represent normal connectors 20. Furthermore, each of sacrificial connectors 22 is marked with a number. In some embodiments, the sacrificial connectors 22 that are marked with a same number are probed in a same probe step. Throughout FIGS. 4 through 20, for clarity of the Figures, some features are labeled, while some other features are not labeled. It is noted that the unlabeled features represent essentially the same types of features as those labeled features having the same shape and shading.

FIGS. 4 through 6 illustrate a 1-to-1 connection scheme and the respective probe scheme of stack-probe units 40, with a single normal connector 20 connected to a single sacrificial connector 22 to form a stack-probe unit 40. Referring to FIG. 4, a plurality of stack-probe units 40 in package component 100 is illustrated, and is arranged with a repeated pattern such as an array, in accordance with some embodiments. Sacrificial connectors 22 and normal connectors 20 are arranged in a same layout pattern. For example, as illustratively shown in FIG. 4, normal connectors 20 are arranged in four columns and four rows. Similarly, sacrificial connectors 22 are also arranged in four columns and four rows. For illustration, normal connectors 20 and sacrificial connectors 22 are said to have the same layout pattern or the same pattern. As a result, if all sacrificial connectors 22 are shifted by substantially a same direction, and for substantially a same distance, each of sacrificial connectors 22 may overlap one of normal connectors 20. Furthermore, sacrificial connectors 22 that are marked with a "1" may have exactly the same pattern as that of sacrificial connectors 22 that are marked with a "2," except sacrificial connectors 22 that are marked with a "2" are shifted by a same direction, and for a same distance, from the sacrificial connectors 22 that are marked with a "1."For example, sacrificial connectors 22 marked with a "1" are arranged in two rows. Similarly, sacrificial connectors 22 marked with a "2" are arranged in two rows. Further, each row of sacrificial connectors 22 marked with a "1" corresponds to a row of sacrificial connectors marked with a "2". With sacrificial connectors 22 that are marked with a "1" having exactly the same pattern as that of sacrificial connectors 22 that are marked with a "2," it is possible to separate the probing of sacrificial connectors 22 that are marked with a "1" from the probing of sacrificial connectors 22 that are marked with a "2." For example, in a first probing step, the sacrificial connectors 22 that are marked with a "1" are probed, while the sacrificial connectors 22 that are marked with a "2" are not probed. Probing may be performed using probe card 42, which is schematically illustrated in FIG. 5, wherein circles 44 represent probe pins. During probing the sacrificial connectors 22 that are marked with a "1," probe pins 44 are aligned to, and are put to contact with, the sacrificial connectors 22 that are marked with a "1". Electrical signals are then sent to and/or received from the sacrificial connectors 22 that are marked with a "1" through probe pins 44. Accordingly, the connection of the sacrificial connectors 22 that are marked with a "2" may be detected. In a second probing step, the sacrificial connectors 22 that are marked with a "2" may be probed using the same probe card 42, while the sacrificial connectors 22 that are marked with a "1" are not probed. During the probing of the sacrificial connectors 22 that are marked with a "2," electrical signals are sent to and/or received from the sacrificial connectors 22 that are marked with a "2" through probe pins 44. Accordingly, the connection of the sacrificial connectors 22 that are marked with a "2" may be detected. Using this scheme, probe card 42 shown in FIG. 5 may be reused to probe devices that include more connectors than the number of probe pins in probe card 42 because the connectors in a device may be probed by probe card 42 in a plurality of probes, rather than being probed in a single probing step. FIG. 4 also illustrates the spacing between the rows of connectors 20 and 22. In some embodiments, the spacing between each two rows of connectors is the same. For illustration, spacing S1 represents the distance of probe card pitch while spacing S2 represents the distance between proximate rows of connectors. In some embodiments, spacing S1 equals to two times spacing S2.

FIG. 6 illustrates a top view of a package in which package component 200 is bonded to package component 100, in accordance with some embodiments. Package component 200 is bonded to package component 100 after the probing, such as illustratively explained with reference to FIG. 5. In the top view, package component 200 covers a portion of package component 100. Additional stack-probe units 40A may be formed in package component 100, and each stack-probe unit 40A is electrically coupled to a corresponding boundary stack-probe unit 40, which is close to the boundary of package component 200. Connections 47 represent the conductive features for connecting stack-probe units 40A to the respective stack-probe units 40. Stack-probe units 40A are not covered by package component 200. Accordingly, after the bonding of package components 100 and 200, sacrificial connectors 22 in stack-probe units 40A are still exposed and can still be used for probing stack-probe units 40.

In FIGS. 4 and 6 and other figures in accordance with various embodiments, alignment marks 46 are illustrated. Alignment marks 46 can be used for aligning probe card 42 in FIG. 5 during the probing of sacrificial connectors 22, and for aligning the bonding of package components 100 and 200.

Figure 8:
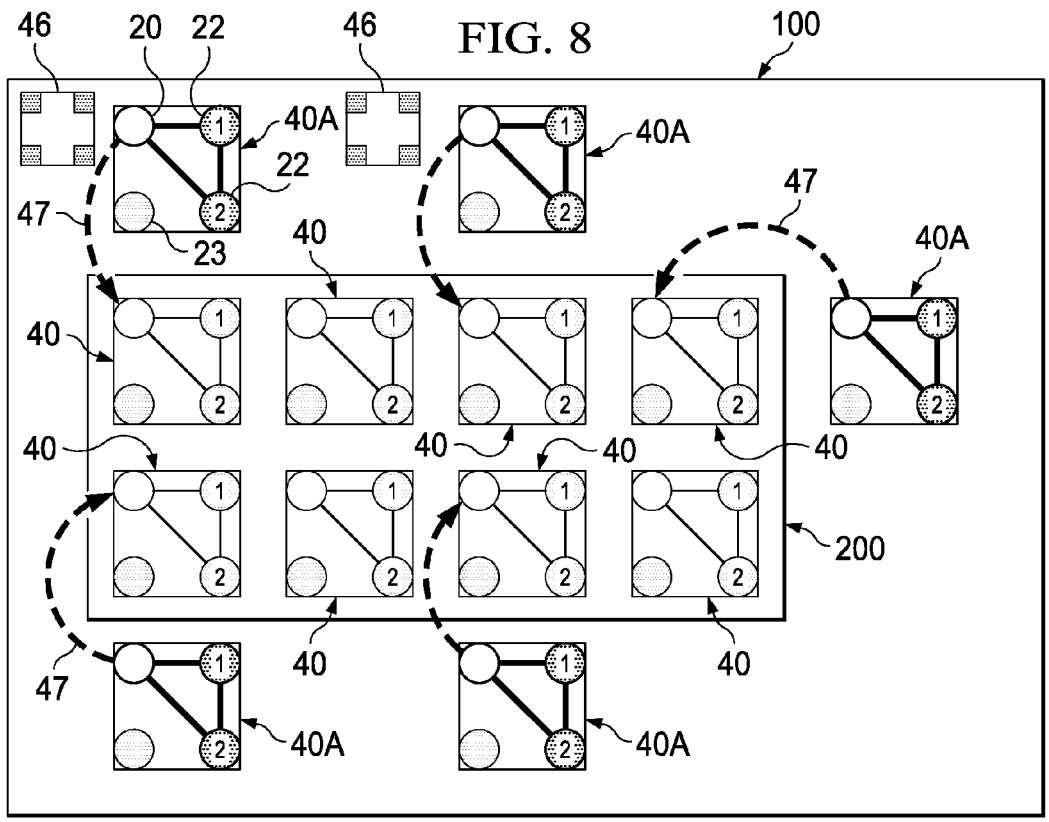

In some embodiments, each of sacrificial connectors 22 may be used for probing until it is damaged. To increase the maximum number of probes that can be performed, more sacrificial connectors 22 may be included in the same stack-probe unit 40. FIGS. 7 and 8 illustrate a 1-to-2 connection scheme and the respective probe scheme, in which a single normal connector 20 is connected to two sacrificial connectors 22 to form a stack-probe unit 40. With two sacrificial connectors 22, the maximum number of probing is doubled compared with the 1-to-1 connection scheme. In each stack-probe unit 40, a dummy connector 23 may be formed. Dummy connectors 23 may be used to make the pattern density of connectors more uniform. For example, without the dummy connectors 23, three corners of each square shown in FIG. 7 correspond to three connectors, but there is no connector at the fourth corner. With the addition of dummy connectors 23, each corner of a square corresponds to one connector. The distribution of the connectors are therefore more evenly or more uniform. As a result, the defects caused by the non-uniformity in the density of connectors may be reduced.

As shown in FIG. 7, a plurality of stack-probe units 40 in package component 100 is arranged as an array. Sacrificial connectors 22 that are marked with the same number (for example "1") may have the same pattern as that of normal connectors 20. Sacrificial connectors 22 that are marked with a "2" may have exactly the same pattern as that of normal connectors 20, and should have the same pattern as sacrificial connectors 22 marked with a "1." As a result, if all sacrificial connectors 22 marked with a "1" in all stack-probe units 40 are shifted in a same direction (for example, to the left), and for a same distance, each shifted sacrificial connector 22 marked with a "1" may overlap a respective normal connector 20 in the same stack-probe unit 40. Similarly, if all sacrificial connectors 22 marked with a "2" in all stack-probe units 40 are shifted in a same direction (for example, to the upper left), and for a same distance, each shifted sacrificial connector 22 marked with a "2" may overlap a respective normal connector 20 in the same stack-probe unit 40. All sacrificial connectors 22 and normal connector 20 in the same stack-probe unit 40 are interconnected. In some embodiments, two probes are performed, with the sacrificial connectors 22 that are marked with the same number are probed in the same probing step. In contrast, the sacrificial connectors 22 that are marked with different numbers are probed in different probing steps.

FIG. 8 illustrates a top view of a package in which package component 200 is bonded to package component 100 after the probing as illustratively explained with reference to FIG. 7, in accordance with some embodiments. In the top view, package component 200 covers a portion of package component 100. Additional stack-probe units 40A may be formed in package component 100, and each stack-probe unit 40A is electrically coupled to a corresponding boundary stack-probe unit 40 that is close to the boundary of package component 200. Stack-probe units 40A are not covered by package component 200. Accordingly, after the bonding of package components 100 and 200, sacrificial connectors 22 in stack-probe units 40A can still be used for probing boundary stack-probe units 40 that are coupled to stack-probe units 40A.

Figure 9:
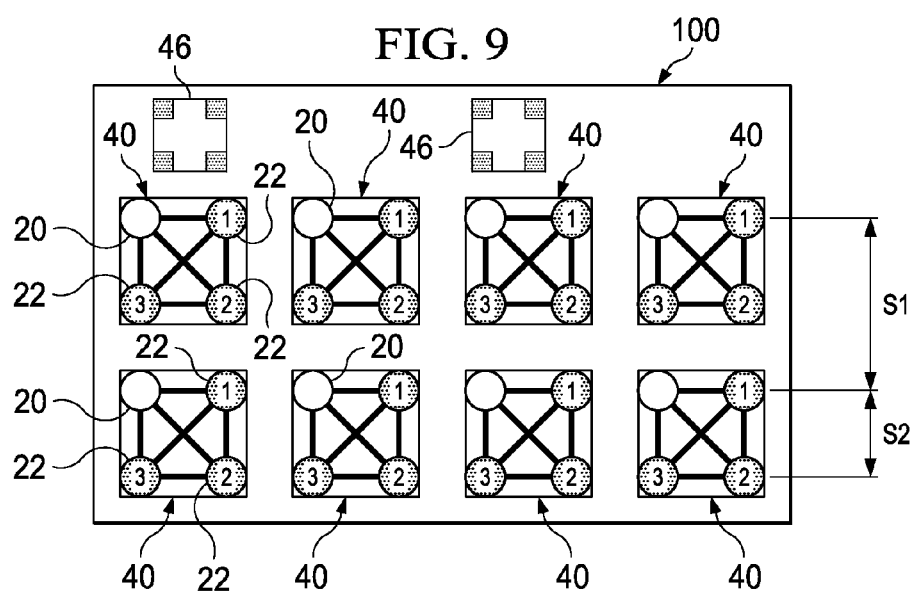
Figure 10:
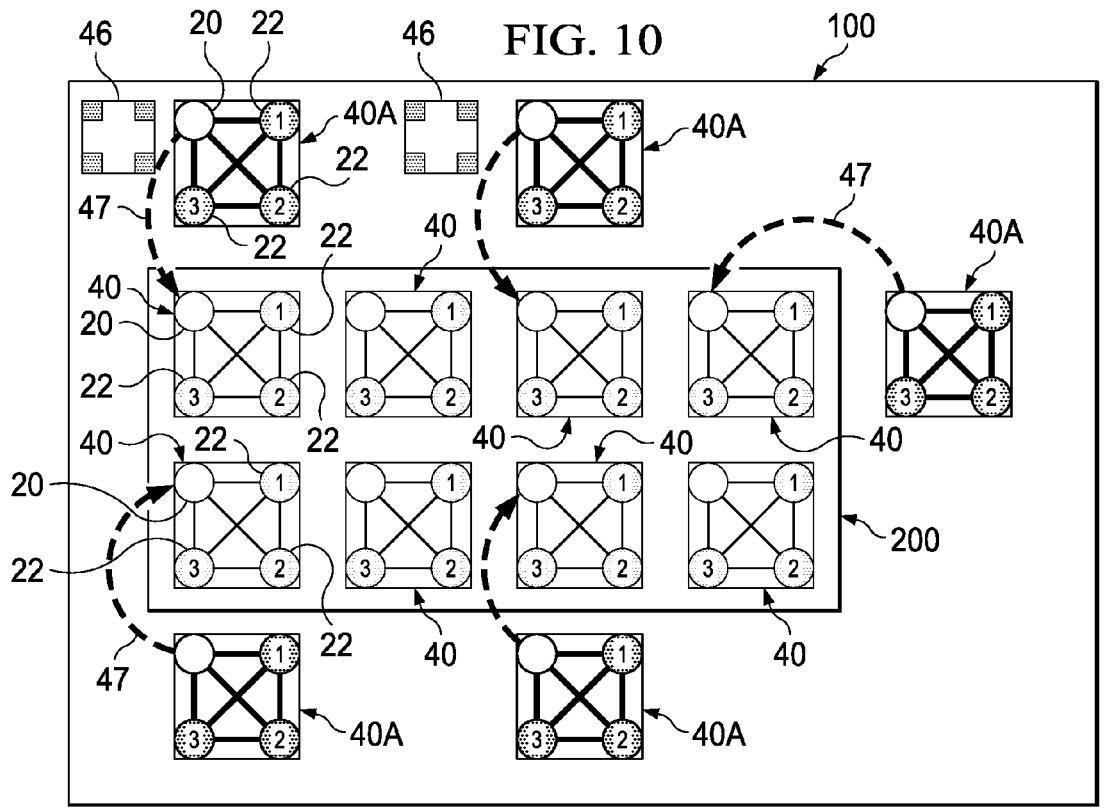

FIGS. 9 and 10 illustrate a 1-to-3 connection scheme and the respective probe scheme, in which a single normal connector 20 is connected to three sacrificial connectors 22 to form a stack-probe unit 40, in accordance with some embodiments. With three sacrificial connectors 22, the probing chance is tripled compared with that in the 1-to-1 connection scheme. The probe structure in FIGS. 9 and 10 is similar to the structure in FIGS. 7 and 8, respectively, except that in each of the stack-probe units 40 in FIGS. 9 and 10, three sacrificial connectors 22 are interconnected, and are connected to a single normal connector 20.

Figure 11:
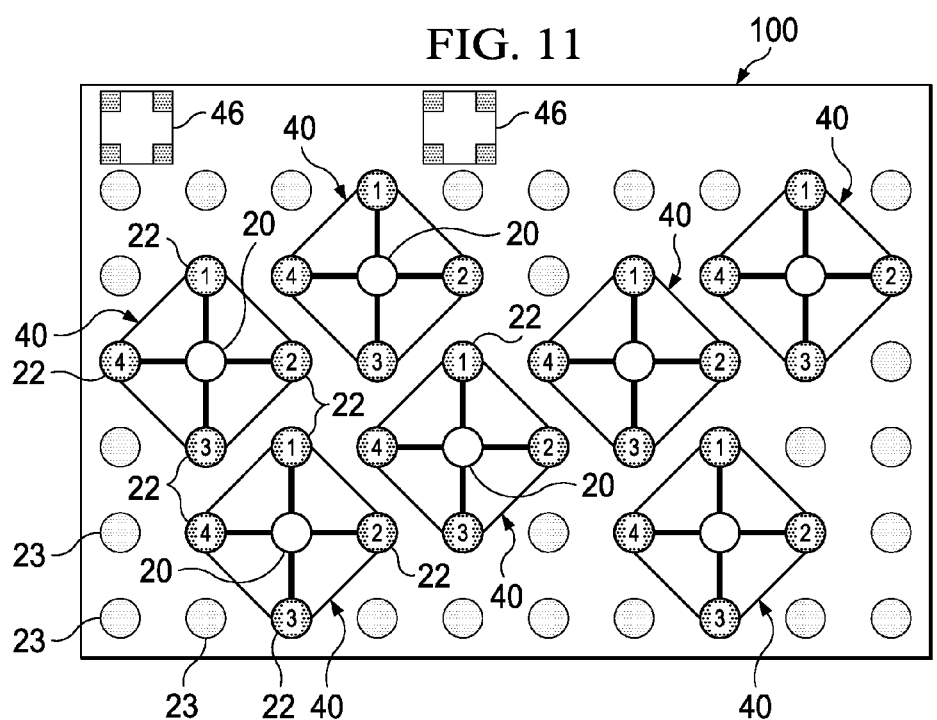
Figure 12:
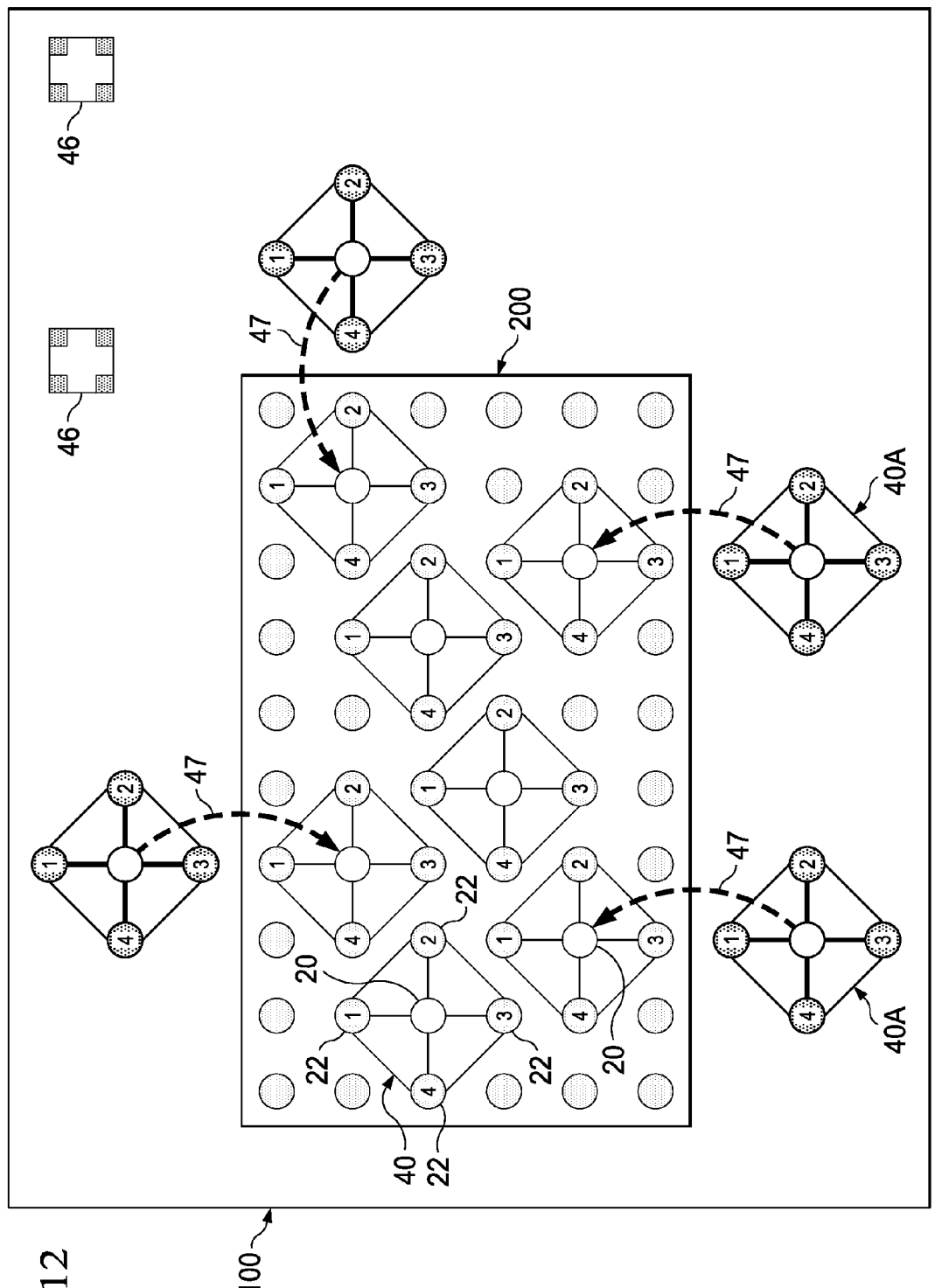

FIGS. 11 and 12 illustrate a 1-to-4 connection scheme and the respective probe scheme, in which a single normal connector 20 is connected to four sacrificial connectors 22 to form a stack-probe unit 40, in accordance with some embodiments. In various embodiments, stack-probe units 40 may be arranged as an array, or arranged in other patterns such as are shown in FIG. 11. FIG. 12 illustrates the stacking of package components 100 and 200. Similar to FIGS. 6, 8, and 10, stack-probe units 40A are not covered by package component 200, and each stack-probe unit 40A is electrically coupled to a corresponding boundary stack-probe unit 40. Accordingly, after bonding package components 100 and 200, sacrificial connectors 22 in stack-probe units 40A can still be available for probing.

In the previously discussed embodiments, each of stack-probe units 40 includes a single normal connector 20. To add the redundancy for normal connectors 20, one stack-probe unit 40 may include a plurality of normal connectors 20 that are interconnected, and are connected to the sacrificial connectors 22 in the same stack-probe unit 40.

Figure 13:
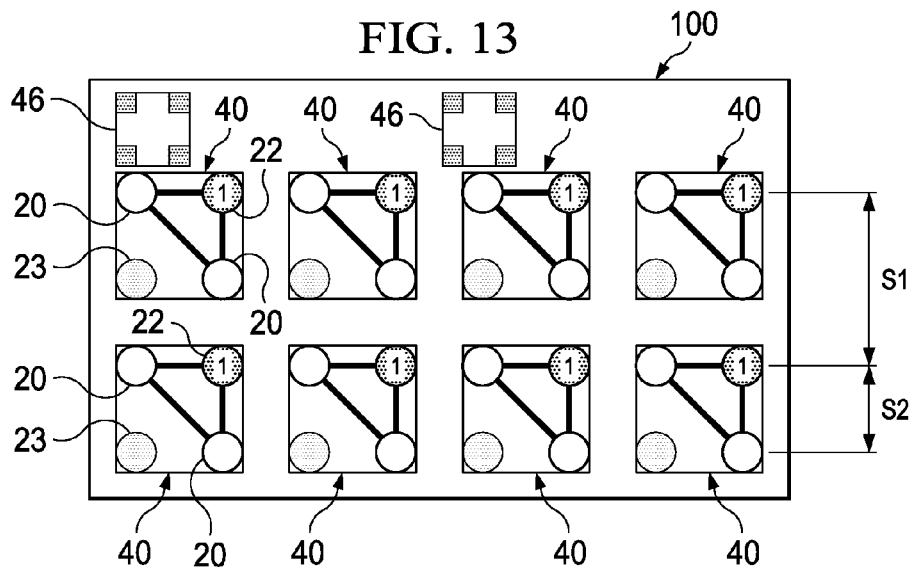
Figure 14:
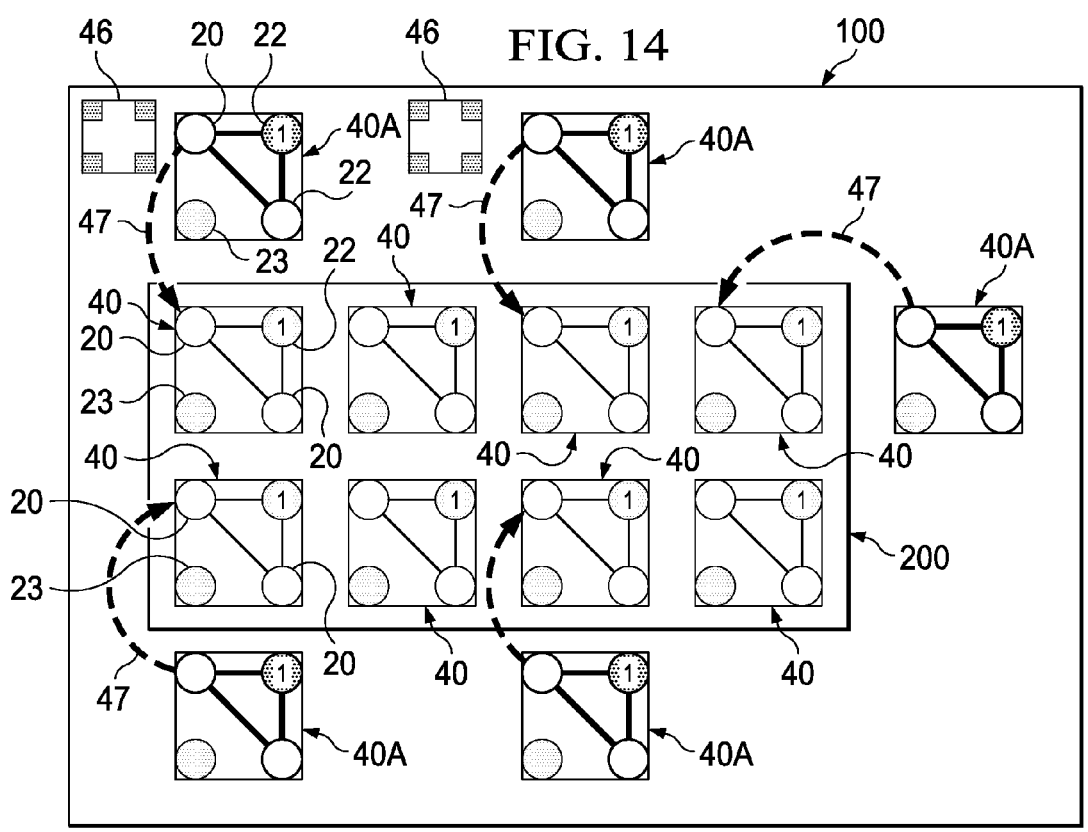

FIGS. 13 and 14 illustrate a 2-to-1 connection scheme and the respective probe scheme, wherein two normal connectors 20 are connected to one sacrificial connector 22 to form one stack-probe unit 40, in accordance with some embodiments. To make the pattern density of normal connectors 20 and sacrificial connector 22 uniform, a dummy connector 23 may be added into a stack-probe unit 40. Normal connectors 20, sacrificial connector 22, and dummy connector 23 may be located at the corners of a square, as illustratively shown in FIG. 13. FIG. 14 illustrates the stacking of package components 100 and 200. Again, stack-probe units 40A are not covered by package component 200, and each stack-probe unit 40A is electrically coupled to a corresponding boundary stack-probe unit 40 in package component 100. Accordingly, after the bonding of package components 100 and 200, sacrificial connectors 22 in stack-probe units 40A can still be used for probing.

Figure 15:
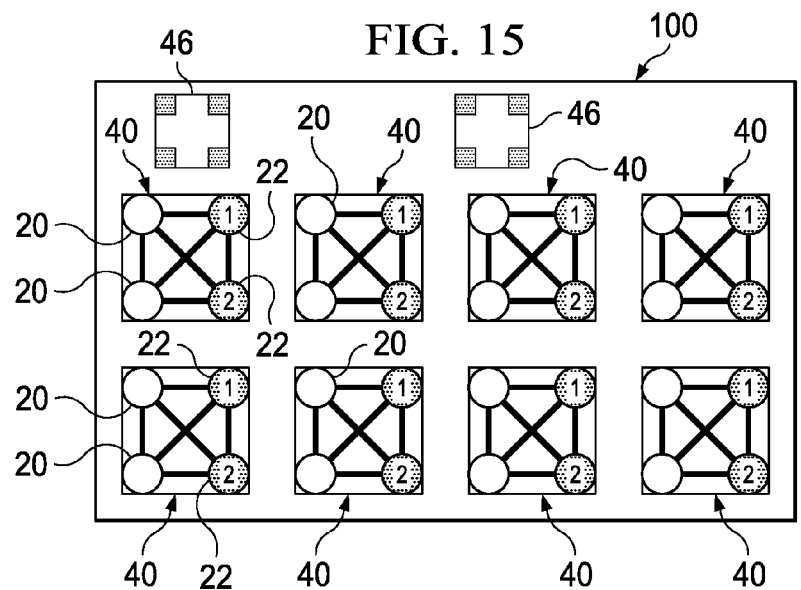
Figure 16:
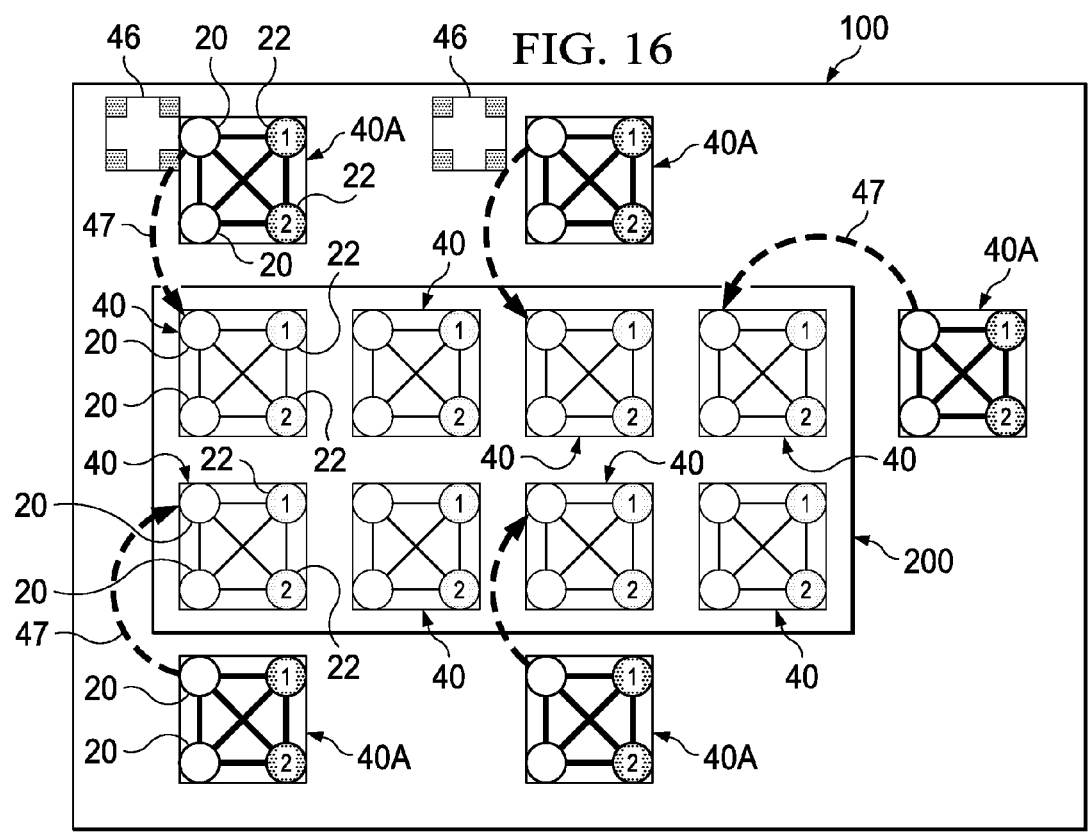

FIGS. 15 and 16 illustrate a 2-to-2 connection scheme and the respective probe scheme, wherein two normal connectors 20 are connected to two sacrificial connectors 22 to form stack-probe unit 40, in accordance with some embodiments. In some embodiments, a sacrificial connectors 22 that is marked with a "1" has a same pattern (layout) as a sacrificial connector 22 that is marked with a "2." Accordingly, by shifting the sacrificial connectors 22 that are marked with a "1," the pattern of the sacrificial connectors 22 that are marked with a "2" can be generated. Again, two probes may be performed using a same probe card similar to what is shown in FIG. 5, with the first probe being performed to probe the sacrificial connector 22 that are marked with a "1," and the second probe being performed to probe the sacrificial connector 22 that are marked with a "2."

FIG. 16 illustrates the stacking of package components 100 and 200. Again, stack-probe units 40A are not covered by package component 200, and each stack-probe unit 40A is electrically coupled to a corresponding boundary stack-probe unit 40 that is close to the boundary of package component 200. Accordingly, after the bonding of package components 100 and 200, sacrificial connectors 22 in stack-probe units 40A can still be used for probing.

Figure 18:
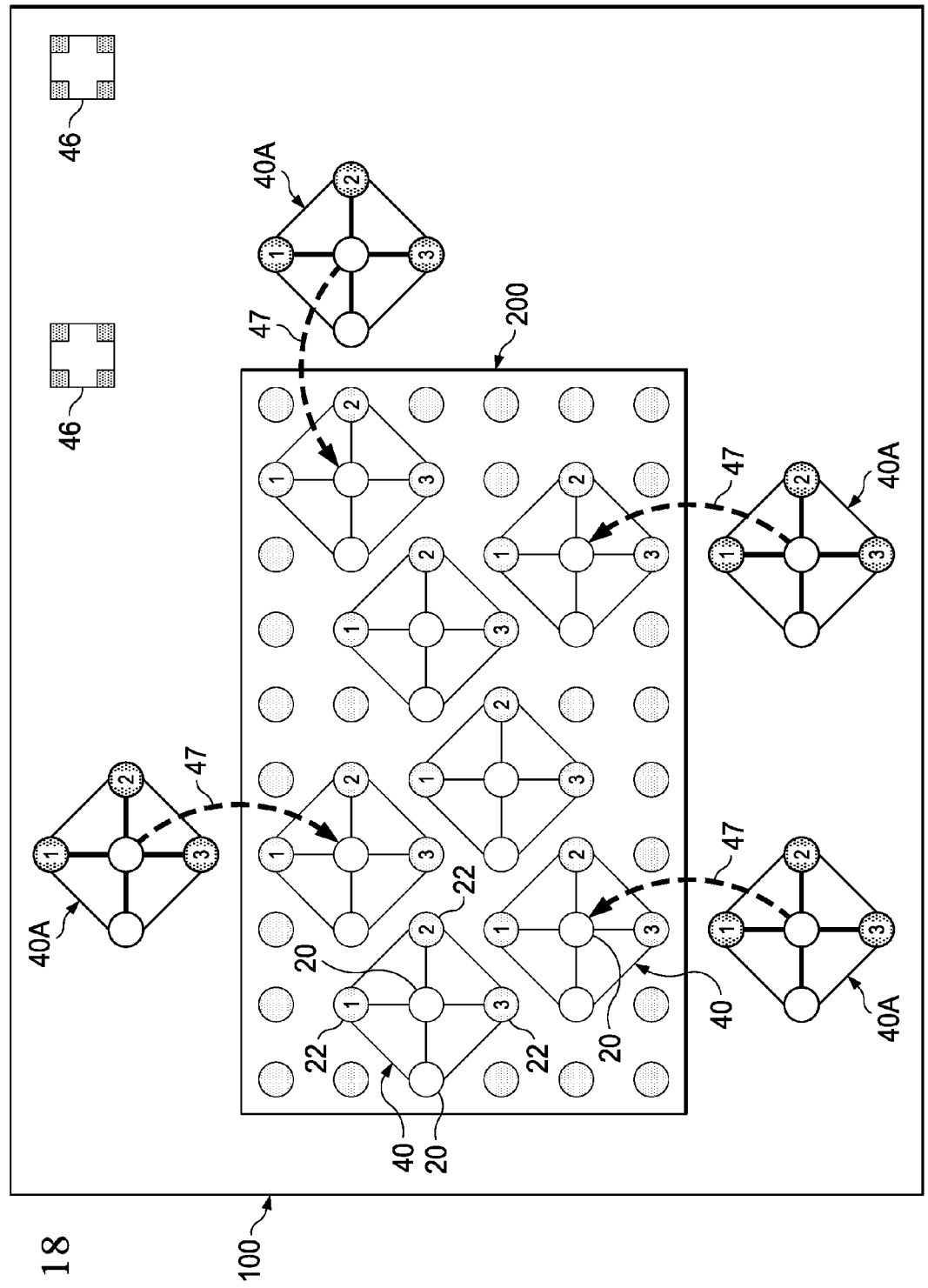
Figure 20:
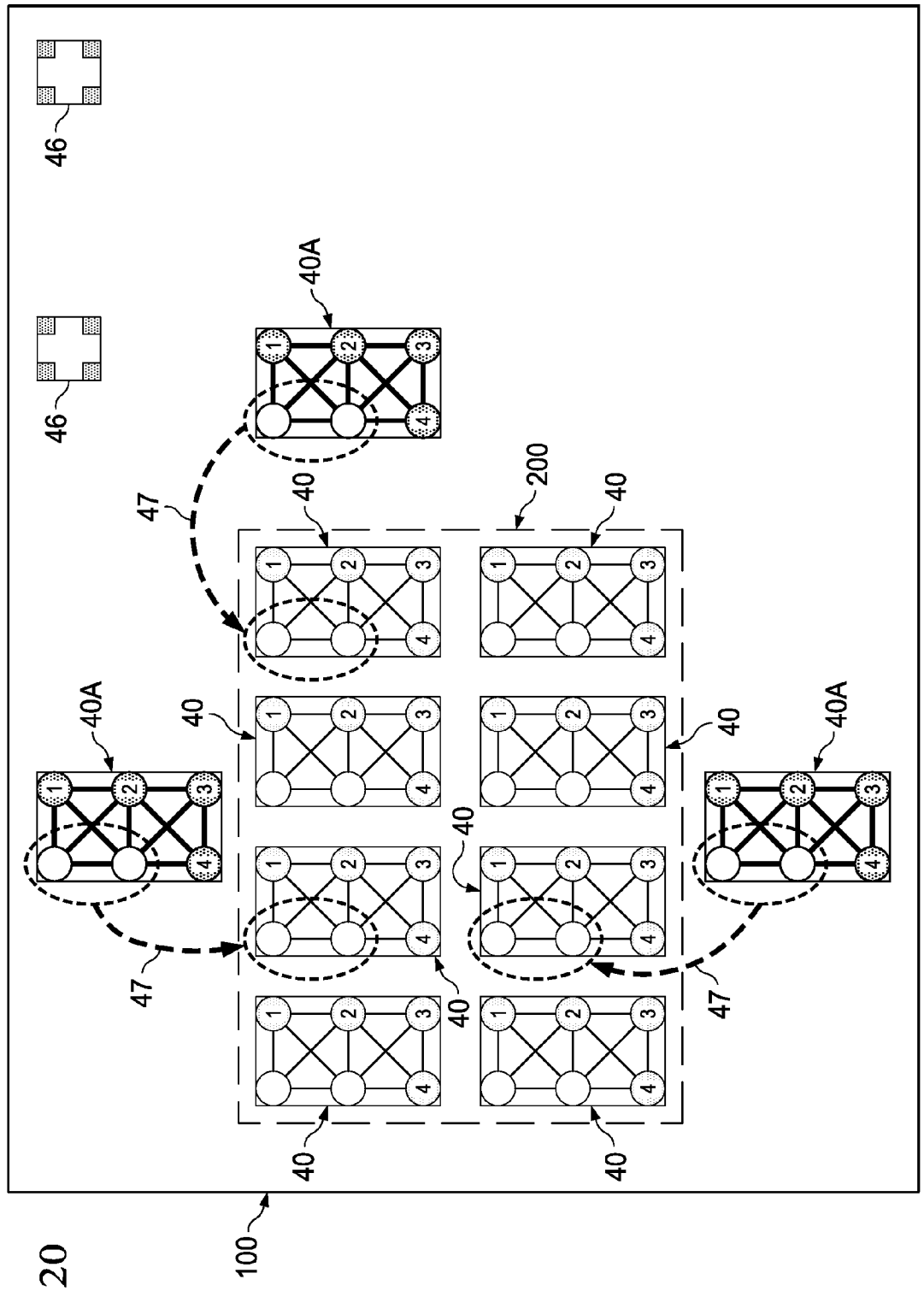
Figure 21:
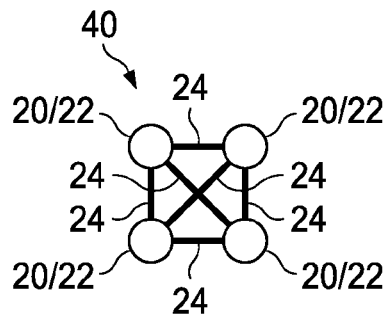
FIGS. 21 through 24 illustrate normal connectors and sacrificial connectors having various top-view shapes in accordance with some embodiments.

FIGS. 17 and 18 illustrate a 2-to-3 connection scheme and the respective probe scheme, wherein two normal connectors 20 are connected to three sacrificial connectors 22 to form a stack-probe unit 40. FIGS. 19 and 20 illustrate a 2-to-4 connection and probe scheme, wherein two normal connectors 20 are connected to four sacrificial connectors 22 to form a stack-probe unit 40. Again, in each of FIGS. 17 through 20, a number is marked on each of sacrificial connectors 22, and the sacrificial connectors 22 that are marked with the same number may be probed in a same probe step, while sacrificial connectors 22 that are marked with different numbers are probed in different probe steps, but may share a same probe card.

Figure 22:
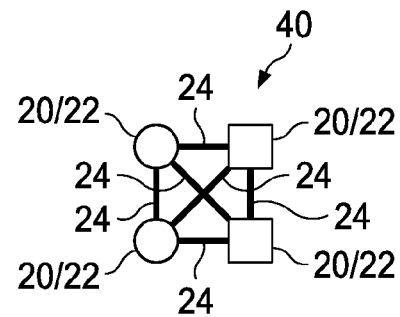
Figure 23:
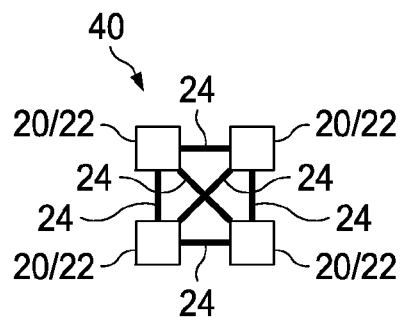
Figure 24:
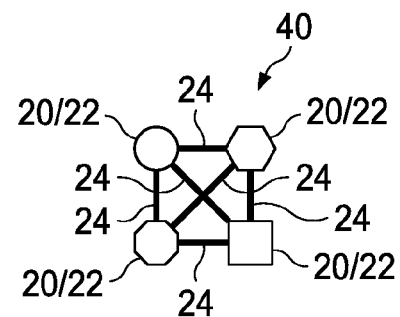

FIG. 21 through 24 illustrate that normal connectors 20 and sacrificial connectors 22 may have different shapes, different sizes, and/or different structures in accordance with some embodiments. For example, in FIG. 21, normal connectors 20 and/or sacrificial connector 22 may have a circular top-view shape. In FIG. 22, normal connectors 20 and/or sacrificial connector 22 may have different top-view shapes, such as circles and squares, wherein the different shapes may be mixed in a same stack-probe unit 40. In FIG. 23, normal connectors 20 and sacrificial connectors 22 may have a rectangle top-view shape. In FIG. 24, each of normal connectors 20 and sacrificial connector 22 may have a shape different from the shape of other ones, wherein different shapes are within the scope of various embodiments. Exemplary shapes include circles, hexagons, octagons, rectangles, etc.

Figure 25:
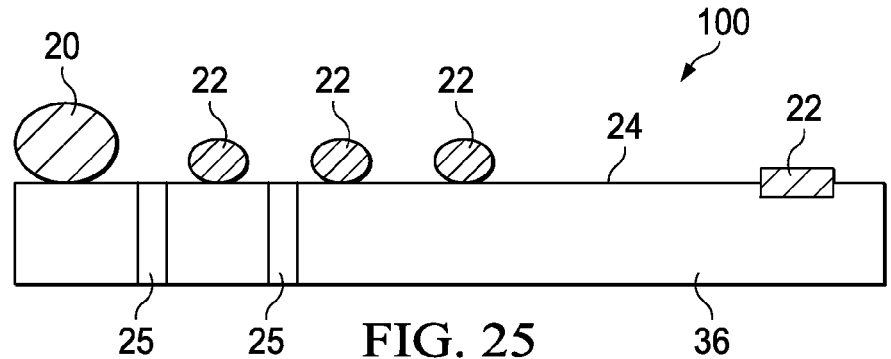
FIG. 25 illustrates a cross-sectional view of a package component in accordance with some embodiments, wherein normal connectors and sacrificial connectors may have different sizes and structures, and may be formed of different materials.

FIG. 25 illustrates that besides the shapes, the sizes and the structures of normal connectors 20 may also be different from the sizes and the structures of sacrificial connectors 22, in accordance with some embodiments. For example, the top-view sizes of normal connectors 20 may be greater than the top-view sizes of sacrificial connectors 22. Furthermore, normal connectors 20 and sacrificial connectors 22 may have various structures such as solder balls, bond pads, or the like, and the structures of normal connectors 20 and sacrificial connectors 22 may be different from each other, in accordance with various embodiments.

In the exemplary embodiments shown in FIGS. 4 through 20, the lines drawn between normal connectors 20 and sacrificial connectors 22 in the same stack-probe unit 40 may form either 90 degree angles or 45 degree angles. In other embodiments, the lines drawn between normal connectors 20 and sacrificial connectors 22 in the same stack-probe unit 40 may form other angles such as 60 degrees, as shown in FIG. 26. This may result in a desirable reduction in the chip area occupied by normal connectors 20 and/or sacrificial connectors 22. In these embodiments, stack-probe units 40 may still be arranged as an array or any other applicable patterns.

In accordance with some embodiments, a package component includes a stack-probe unit, which further includes a first-type connector, and a second-type connector connected to the first-type connector. The first-type connector and the second-type connector are exposed through a surface of the package component.

In accordance with other embodiments, a package component includes a plurality of stack-probe units arranged with a repeated pattern. Each of the plurality of stack-probe units includes a first-type connector, and a second-type connector connected to the first-type connector. The first-type connector and the second-type connector are disposed at a surface of the first package component.

In accordance with yet other embodiments, a method includes performing a first probe step on second-type connectors that are on a surface of a first package component to determine a status of first-type connectors, wherein the first-type connectors are at a surface of the first package component. Each of the second-type connectors is electrically coupled to one of the first-type connectors.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A device comprising:
  a first package component comprising:
    a first stack-probe unit comprising:
      a first first-type connector;
      a first second-type connector connected to the first first-type connector;
    wherein the first first-type connector and the first second-type connector are exposed through a surface of the first package component, wherein the first first-type connector and the first second-type connector have a same structure;

a second package component comprising a connector bonded to the first first-type connector, wherein the second-type connector is not used for bonding to the second package component;

wherein the first package component further comprises a second stack-probe unit not covered by the second package component, and wherein the second stack-probe unit comprises:

a second first-type connector; and a second second-type connector connected to the first first-type connector and the second first-type connector, wherein the second first-type connector and the second second-type connector are at a surface of the first package component;

wherein the first first-type connector and the first second-type connector are covered by the second package component.

2. The device of claim 1 further comprising a plurality of stack-probe units having a same structure as the first stack-probe unit, wherein the plurality of stack-probe units and the first stack-probe unit are arranged as an array.

3. The device of claim 1, wherein the first first-type connector and the first second-type connector have different top-view sizes.

4. A device comprising:
a first package component comprising:
a plurality of stack-probe units arranged with a repeated pattern, wherein each of the plurality of stack-probe units comprises:
a first first-type connector; and
a first second-type connector connected to the first first-type connector, wherein the first first-type connector and the first second-type connector are disposed at a surface of the first package component;
a second package component comprising connectors bonded to, and electrically connected to, the first first-type connectors of the plurality of stack-probe units, wherein the second package component does not comprise conductive features that are bonded to the first second-type connectors of the plurality of stack-probe units; and
an additional stack-probe unit in the first package component, wherein the additional stack-probe unit has a structure identical to structures of the plurality of stack-probe units, and the stack-probe unit is not overlapped by the second package component, and the additional stack-probe unit is electrically connected to one of the plurality of stack-probe units.

5. The device of claim 4, wherein the plurality of stack-probe units has a same structure, and wherein first first-type connectors in the plurality of stack-probe units are arranged as a first pattern being the same as a second pattern of first second-type connectors in the plurality of stack-probe units, and wherein the first second-type connectors are shifted from respective ones of the first-type connectors by a same first shift distance and in a same first direction.

6. The device of claim 5, wherein each of the plurality of stack-probe units further comprises a second second-type connector connected to the first first-type connector and the first second-type connector, wherein second second-type connectors in the plurality of stack-probe units are arranged as a third pattern being the same as the second pattern, and wherein the second second-type connectors are shifted from respective ones of the first second-type connectors by a same second shift distance and in a same second direction.

7. The device of claim 5, wherein each of the plurality of stack-probe units further comprises a second first-type connector connected to the first first-type connector and the first second-type connector, wherein second first-type connectors in the plurality of stack-probe units have a third pattern being the same as the second pattern.

8. The device of claim 4, wherein the plurality of stack-probe units is arranged as an array.

9. A device comprising:
a first package component comprising:
a first connector; and
a second connector, wherein the first connector and the second connector are at a top surface of the first package component;
an electrical connection electrically interconnecting the first connector and the second connector;
a first solder region over and bonded to the first connector; and
a second package component over the first package component, wherein the second package component comprises a first additional electrical connector bonded to the first electrical connector of the first package component through the first solder region, wherein the second connector of the first package component is overlapped by the second package component, and wherein the second package component is free from any electrical connector that is bonded to the second connector of the first package component; and
a third connector in the first package component, wherein the third connector is not overlapped by the second package component, and the third connector is electrically connected to the first connector.

10. The device of claim 9, wherein a first top surface of the first connector of the first package component is coplanar with a second top surface of the second connector of the first package component.

11. The device of claim 9, wherein the first connector of the first package component and the second connector of the first package component are different in at least one of top view sizes or top view areas.

12. The device of claim 9, wherein the first package component is selected from the group consisting essentially of a device die, an interposer, a package substrate, and combinations thereof.

13. The device of claim 9 further comprising:
a fourth connector electrically connected to both the first connector and the second connector; and
a fifth connector electrically connected to the first connector, the second connector, and the fourth connector, wherein the fourth connector and the fifth connector are in the first package component, and are coplanar with the first connector and the second connector; and
a second solder region bonding the fourth connector to a second additional electrical connector in the second package component, wherein the second package component is free from any electrical connector bonded to the fifth connector of the first package component.

14. The device of claim 1 wherein the first package component is comprises a die bonded to a substrate/interposer.

15. The device of claim 1 further wherein the second first-type connector and the second second-type connector have different top-view sizes.

16. The device of claim 1 wherein the second package component is selected from the group consisting essentially of a device die, an interposer, a package substrate, and combinations thereof.

17. The device of claim 1, wherein a first top surface of the first first-type connector of the first package component is coplanar with a second top surface of the second first-type connector of the first package component.

18. The device of claim 4 wherein the first package component is selected from the group consisting essentially of a device die, an interposer, a package substrate, and combinations thereof.

19. The device of claim 9 wherein the first package component is comprises a die bonded to a substrate/interposer.

* * * * *